(12) United States Patent
Pesavento

(10) Patent No.: US 8,139,411 B1
(45) Date of Patent: Mar. 20, 2012

(54) PFET NONVOLATILE MEMORY

(75) Inventor: Alberto Pesavento, Seattle, WA (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 13/008,349

(22) Filed: Jan. 18, 2011

Related U.S. Application Data

(63) Continuation of application No. 12/239,696, filed on Sep. 26, 2008, now Pat. No. 7,894,261.

(60) Provisional application No. 61/055,368, filed on May 22, 2008, provisional application No. 61/061,004, filed on Jun. 12, 2008.

(51) Int. Cl.
*G11C 11/34* (2006.01)
(52) U.S. Cl. ............................... 365/185.05; 365/185.24
(58) Field of Classification Search ............. 365/185.05, 365/185.24
See application file for complete search history.

(56) References Cited

U.S. PATENT DOCUMENTS

| | | | |
|---|---|---|---|
| 4,090,258 A | 5/1978 | Cricchi |
| 4,132,904 A | 1/1979 | Harari |
| 4,158,239 A | 6/1979 | Bertin |
| 4,384,288 A | 5/1983 | Walton |
| 4,388,524 A | 6/1983 | Walton |
| 4,541,073 A | 9/1985 | Brice et al. |
| 4,546,241 A | 10/1985 | Walton |
| 4,571,704 A | 2/1986 | Bohac, Jr. |
| 4,575,823 A | 3/1986 | Fitzpatrick |
| 4,580,041 A | 4/1986 | Walton |
| 4,758,869 A | 7/1988 | Eitan et al. |
| 4,935,702 A | 6/1990 | Mead et al. |
| 4,953,928 A | 9/1990 | Anderson et al. |
| 5,018,102 A | 5/1991 | Houston |
| 5,068,622 A | 11/1991 | Mead et al. |
| 5,086,331 A | 2/1992 | Hartgring et al. |
| 5,124,568 A | 6/1992 | Chen et al. |
| 5,146,106 A | 9/1992 | Anderson et al. |
| 5,168,464 A | 12/1992 | Stanchak et al. |
| 5,272,368 A | 12/1993 | Turner et al. |
| 5,301,150 A | 4/1994 | Sullivan et al. |
| 5,323,066 A | 6/1994 | Feddeler et al. |

(Continued)

FOREIGN PATENT DOCUMENTS

EP 0298618 A2 1/1989

(Continued)

OTHER PUBLICATIONS

Carley, L. Richard, "Trimming Analog Circuits Using Floating-Gate Analog MOS Memory", IEEE Journal of Solid-State Circuits, vol. 24, No. 6, pp. 1569-1575, Dec. 1989.

(Continued)

*Primary Examiner* — Michael Tran
(74) *Attorney, Agent, or Firm* — Fenwick & West LLP

(57) ABSTRACT

A non-volatile memory integrated circuit includes multiple memory cells, each memory cell including a first MOS transistor, a first control capacitor, and a first floating gate coupled to the first MOS transistor and the first control capacitor. A first read/write control signal is provided having at least a first state and a second state and coupled the first MOS transistor. When the control signal is in the first state, the memory cell is configured for readout, and when the control signal is in the second state, the memory cell is configured for writing. Both single-ended and differential memory cells are described. Arrays of such nonvolatile memory cells are also described.

20 Claims, 12 Drawing Sheets

U.S. PATENT DOCUMENTS

| | | | |
|---|---|---|---|
| 5,361,001 A | 11/1994 | Stolfa |
| 5,384,727 A | 1/1995 | Moyal et al. |
| 5,394,367 A | 2/1995 | Downs et al. |
| 5,412,594 A | 5/1995 | Moyal et al. |
| 5,430,670 A | 7/1995 | Rosenthal |
| 5,438,542 A | 8/1995 | Atsumi et al. |
| 5,463,348 A | 10/1995 | Sarpeshkar et al. |
| 5,504,707 A | 4/1996 | Koizumi |
| 5,517,044 A | 5/1996 | Koyama |
| 5,541,878 A | 7/1996 | LeMoncheck et al. |
| 5,596,524 A | 1/1997 | Lin et al. |
| 5,616,942 A | 4/1997 | Song |
| 5,617,358 A | 4/1997 | Kodama |
| 5,623,442 A | 4/1997 | Gotou et al. |
| 5,627,392 A | 5/1997 | Diorio et al. |
| 5,633,518 A | 5/1997 | Broze |
| 5,650,966 A | 7/1997 | Cleveland et al. |
| 5,659,498 A | 8/1997 | Pascucci et al. |
| 5,666,307 A | 9/1997 | Chang |
| 5,677,917 A | 10/1997 | Wheelus et al. |
| 5,687,118 A | 11/1997 | Chang |
| 5,691,939 A | 11/1997 | Chang et al. |
| 5,706,227 A | 1/1998 | Chang et al. |
| 5,717,636 A | 2/1998 | Dallabora et al. |
| 5,729,155 A | 3/1998 | Kobatake |
| 5,731,716 A | 3/1998 | Pascucci |
| 5,736,764 A | 4/1998 | Chang |
| 5,754,471 A | 5/1998 | Peng et al. |
| 5,761,121 A | 6/1998 | Chang |
| 5,763,912 A | 6/1998 | Parat et al. |
| 5,777,361 A | 7/1998 | Parris et al. |
| 5,777,926 A | 7/1998 | Trinh et al. |
| 5,786,617 A | 7/1998 | Merrill et al. |
| 5,790,060 A | 8/1998 | Tesch |
| 5,796,656 A | 8/1998 | Kowshik et al. |
| 5,798,967 A | 8/1998 | Sarin et al. |
| 5,801,994 A | 9/1998 | Chang et al. |
| 5,822,714 A | 10/1998 | Cato |
| 5,825,063 A | 10/1998 | Diorio et al. |
| 5,835,402 A | 11/1998 | Rao et al. |
| 5,841,165 A | 11/1998 | Chang et al. |
| 5,844,300 A | 12/1998 | Alavi et al. |
| 5,854,762 A | 12/1998 | Pascucci |
| 5,875,126 A | 2/1999 | Minch et al. |
| 5,886,566 A | 3/1999 | Park et al. |
| 5,890,199 A | 3/1999 | Downs |
| 5,892,709 A | 4/1999 | Parris et al. |
| 5,892,712 A | 4/1999 | Hirose et al. |
| 5,898,613 A | 4/1999 | Diorio et al. |
| 5,901,084 A | 5/1999 | Ohnakado |
| 5,912,841 A | 6/1999 | Kim |
| 5,912,842 A | 6/1999 | Chang et al. |
| 5,912,937 A | 6/1999 | Goetting et al. |
| 5,914,894 A | 6/1999 | Diorio et al. |
| 5,914,895 A | 6/1999 | Jenne |
| 5,939,945 A | 8/1999 | Thewes et al. |
| 5,966,329 A | 10/1999 | Hsu et al. |
| 5,969,987 A | 10/1999 | Blyth et al. |
| 5,972,804 A | 10/1999 | Tobin et al. |
| 5,982,669 A | 11/1999 | Kalnitsky et al. |
| 5,986,927 A | 11/1999 | Minch et al. |
| 5,990,512 A | 11/1999 | Diorio et al. |
| 6,011,425 A | 1/2000 | Oh et al. |
| 6,028,789 A | 2/2000 | Mehta et al. |
| 6,049,229 A | 4/2000 | Manohar et al. |
| 6,055,185 A | 4/2000 | Kalnitsky et al. |
| 6,060,919 A | 5/2000 | Wilson et al. |
| 6,081,451 A | 6/2000 | Kalnitsky et al. |
| 6,097,634 A * | 8/2000 | Sugiyama ............... 365/185.21 |
| 6,111,785 A | 8/2000 | Hirano |
| 6,125,053 A | 9/2000 | Diorio et al. |
| 6,137,721 A | 10/2000 | Kalnitsky et al. |
| 6,137,722 A | 10/2000 | Kalnitsky et al. |
| 6,137,723 A | 10/2000 | Bergemont et al. |
| 6,137,724 A | 10/2000 | Kalnitsky et al. |
| 6,141,247 A | 10/2000 | Roohparvar et al. |
| 6,144,581 A | 11/2000 | Diorio et al. |
| 6,151,238 A | 11/2000 | Smit et al. |
| 6,166,954 A | 12/2000 | Chern |
| 6,166,978 A | 12/2000 | Goto |
| 6,190,968 B1 | 2/2001 | Kalnitsky et al. |
| 6,208,557 B1 | 3/2001 | Bergemont et al. |
| 6,214,666 B1 | 4/2001 | Mehta |
| 6,222,765 B1 | 4/2001 | Nojima |
| 6,222,771 B1 | 4/2001 | Tang et al. |
| 6,236,223 B1 | 5/2001 | Brady et al. |
| 6,252,802 B1 | 6/2001 | Kramer et al. |
| 6,294,427 B1 | 9/2001 | Furuhata et al. |
| 6,294,810 B1 | 9/2001 | Li et al. |
| 6,294,997 B1 | 9/2001 | Paratore et al. |
| 6,320,788 B1 | 11/2001 | Sansbury et al. |
| 6,331,949 B1 | 12/2001 | Hirano |
| 6,363,006 B2 | 3/2002 | Naffziger et al. |
| 6,363,011 B1 | 3/2002 | Hirose et al. |
| 6,384,451 B1 | 5/2002 | Caywood |
| 6,385,000 B1 | 5/2002 | Ottesen et al. |
| 6,385,090 B1 | 5/2002 | Kitazaki |
| 6,400,622 B1 | 6/2002 | Fujiwara |
| 6,411,545 B1 * | 6/2002 | Caywood ............... 365/185.07 |
| 6,452,835 B1 | 9/2002 | Diorio et al. |
| 6,456,992 B1 | 9/2002 | Shibata et al. |
| 6,469,930 B1 | 10/2002 | Murray |
| 6,469,937 B2 | 10/2002 | Fuchigami et al. |
| 6,477,103 B1 | 11/2002 | Nguyen et al. |
| 6,479,863 B2 | 11/2002 | Caywood |
| 6,515,919 B1 | 2/2003 | Lee |
| 6,529,407 B2 | 3/2003 | Shukuri |
| 6,534,816 B1 | 3/2003 | Caywood |
| 6,538,468 B1 | 3/2003 | Moore |
| 6,563,731 B1 | 5/2003 | Bergemont |
| 6,573,765 B2 | 6/2003 | Bales et al. |
| 6,590,825 B2 | 7/2003 | Tran et al. |
| 6,611,463 B1 | 8/2003 | Mehta et al. |
| 6,633,188 B1 | 10/2003 | Jia et al. |
| 6,641,050 B2 | 11/2003 | Kelley et al. |
| 6,646,919 B1 | 11/2003 | Madurawe et al. |
| 6,654,272 B2 | 11/2003 | Santin et al. |
| 6,661,278 B1 | 12/2003 | Gilliland |
| 6,664,909 B1 | 12/2003 | Hyde et al. |
| 6,678,190 B2 | 1/2004 | Yang et al. |
| 6,693,819 B2 | 2/2004 | Smith et al. |
| 6,724,657 B2 | 4/2004 | Shukuri |
| 6,741,500 B2 | 5/2004 | DeShazo et al. |
| 6,822,894 B1 | 11/2004 | Costello et al. |
| 6,845,029 B2 | 1/2005 | Santin et al. |
| 6,853,583 B2 | 2/2005 | Diorio et al. |
| 6,898,123 B2 | 5/2005 | Owen |
| 6,903,436 B1 | 6/2005 | Luo et al. |
| 6,909,389 B1 | 6/2005 | Hyde et al. |
| 6,946,892 B2 | 9/2005 | Mitarashi |
| 6,950,342 B2 | 9/2005 | Lindhorst et al. |
| 6,954,383 B2 | 10/2005 | Chiu et al. |
| 7,046,549 B2 | 5/2006 | Lee et al. |
| 7,106,642 B2 | 9/2006 | Hojo |
| 7,177,182 B2 | 2/2007 | Diorio et al. |
| 7,212,446 B2 | 5/2007 | Diorio et al. |
| 7,221,596 B2 | 5/2007 | Pesavento et al. |
| 7,283,390 B2 | 10/2007 | Pesavento |
| 7,307,534 B2 | 12/2007 | Pesavento |
| 7,388,420 B2 * | 6/2008 | Diorio et al. ............... 327/525 |
| 7,471,570 B2 * | 12/2008 | Morton et al. ........... 365/185.28 |
| 7,483,310 B1 | 1/2009 | Bu |
| 7,573,749 B2 | 8/2009 | Diorio et al. |
| 7,679,957 B2 | 3/2010 | Ma et al. |
| 2001/0035216 A1 | 11/2001 | Kyle |
| 2001/0035816 A1 | 11/2001 | Beigel et al. |
| 2002/0008271 A1 | 1/2002 | Hsu et al. |
| 2002/0020871 A1 | 2/2002 | Forbes |
| 2002/0122331 A1 | 9/2002 | Santin et al. |
| 2003/0123276 A1 | 7/2003 | Yokozeki |
| 2003/0183871 A1 | 10/2003 | Dugger et al. |
| 2003/0206437 A1 | 11/2003 | Diorio et al. |
| 2003/0218925 A1 | 11/2003 | Torjussen et al. |
| 2003/0222309 A1 | 12/2003 | Roy et al. |
| 2004/0004861 A1 | 1/2004 | Srinivas et al. |
| 2004/0017295 A1 | 1/2004 | Dishongh et al. |
| 2004/0021166 A1 | 2/2004 | Hyde et al. |

| | | | |
|---|---|---|---|
| 2004/0021170 | A1 | 2/2004 | Caywood |
| 2004/0037127 | A1 | 2/2004 | Lindhorst et al. |
| 2004/0052113 | A1 | 3/2004 | Diorio et al. |
| 2004/0080982 | A1 | 4/2004 | Roizin |
| 2004/0136245 | A1 | 7/2004 | Makamura et al. |
| 2004/0195593 | A1 | 10/2004 | Diorio et al. |
| 2004/0206999 | A1 | 10/2004 | Hyde et al. |
| 2004/0240278 | A1 | 12/2004 | Brady et al. |
| 2004/0263319 | A1 | 12/2004 | Huomo |
| 2005/0030827 | A1 | 2/2005 | Gilliland et al. |
| 2005/0063235 | A1* | 3/2005 | Pesavento et al. ............ 365/222 |
| 2005/0149896 | A1 | 7/2005 | Madurawe |
| 2005/0219931 | A1 | 10/2005 | Diorio et al. |
| 2005/0251617 | A1 | 11/2005 | Sinclair et al. |
| 2006/0123186 | A1 | 6/2006 | Loh et al. |
| 2006/0133140 | A1 | 6/2006 | Gutnik et al. |
| 2006/0133175 | A1 | 6/2006 | Gutnik et al. |
| 2006/0221715 | A1 | 10/2006 | Ma et al. |
| 2007/0252701 | A1 | 11/2007 | Berry et al. |
| 2007/0263456 | A1 | 11/2007 | Wang et al. |
| 2008/0112238 | A1 | 5/2008 | Kim et al. |

FOREIGN PATENT DOCUMENTS

| | | |
|---|---|---|
| EP | 0336500 A1 | 3/1989 |
| EP | 0326883 A2 | 8/1989 |
| EP | 0756379 A1 | 1/1997 |
| EP | 0776049 A1 | 5/1997 |
| EP | 0778623 A2 | 6/1997 |
| JP | S54-017655 A | 2/1979 |
| JP | S59-054100 | 3/1984 |
| JP | S60-071582 | 1/1986 |
| JP | H11-510315 A | 7/1996 |
| JP | H09-181204 A | 7/1997 |
| WO | WO 01/26113 A1 | 4/2001 |
| WO | WO 2005/106893 A1 | 11/2005 |

OTHER PUBLICATIONS

Chang, et al., "A CMOS-Compatible Single-Poly Cell for Use as Non-Volatile Memory", International Semiconductor Device Date Research Symposium, Dec. 1-3, 1999, pp. 50-57.
Chang, L. et al., "Non-Volatile Memory Device with True CMOS Compatibility," Electronics Letters, Aug. 19, 1999, pp. 1443-1445, vol. 35, No. 17.
Chinese First Office Action, Chinese Application No. 03820492.4, Jun. 21, 2008, 5 pages.
Chung, S.S. et al., "N-Channel Versus P-Channel Flash EEPROM—Which One Has Better Reliabilities," 39th Annual IEEE International Reliability Physics Symposium, 2001, pp. 67-72.
Declercq et al., "Design and Optimization of High-Voltage CMOS Devices Compatible With a Standard 5 V CMOS Technology", IEEE Custom Integrated Circuits Conference, 1993, pp. 24.6.1-24.6.4.
Dickson, "On-Chip High-Voltage Generation in MNOS Integrated Circuits Using an Improved Voltage Multiplier Technique", IEEE Journal of Solid-State Circuits, vol. SC-11, No. 3, Jun. 1976, pp. 374-378.
Diorio, C. et al., "A High-Resolution Non-Volatile Analog Memory Cell," IEEE International Symposium on Circuits and Systems, 1995, pp. 2233-2236, vol. 3.
Diorio, C. et al., "A Floating-Gate MOS Learning Array with Locally Computed Weight Updates," IEEE Transactions on Electron Devices, Dec. 1997, pp. 1-10, vol. 44, No. 12.
Diorio, C. "A p-Channel MOS Synapse Transistor with Self-Convergent Memory Writes", IEEE Transactions on Electron Devices, vol. 47, No. 2, pp. 464-472, Feb. 2000.
European Examination Report, European Application No. 03763311.2, May 18, 2005, 4 pages.
European Examination Report, European Application No. 03763311.2, Feb. 7, 2006, 3 pages.
European Examination Report, European Application No. 03763311.2, Jun. 26, 2006, 4 pages.
Herdt, C. et al., "Analysis, Measurement, and Simulation of Dynamic Write Inhibit in an nvSRAM Cell," IEEE Transactions on Electron Devices, May 1992, pp. 1191-1196, vol. 39, No. 5.
IBM Technical Disclosure Bulletin, "Fuse Circuit With Zero DC Current," Jul. 1987, IBM Corporation, vol. 30 No. 2.

International Search Report dated Jan. 20, 2004, for Application No. PCT/US03/23724, 7 pages.
Partial International Search for International Application No. PCT/US03/31792, date mailed Apr. 2, 2004.
Invitation to Pay Additional Fees (Partial International Search), Application No. PCT/US 03/31792, date of mailing Apr. 22, 2004.
International Search Report, International Application No. PCT/US 03/31792, date of mailing Aug. 12, 2004.
International Search Report, for International Application No. PCT/US2005/013644, date mailed Aug. 3, 2005.
Written Opinion for International Application No. PCT/US2005/013644, Aug. 2005.
International Preliminary Report on Patentability for International Application No. PCT/US2005/013644, Oct. 25, 2006.
International Search Report for International Application No. PCT/US05/10434, date of mailing Sep. 13, 2005.
Written Opinion for International Application No. PCT/US05/10434, date of mailing Sep. 2005.
International Preliminary Report on Patentability for International Application No. PCT/US05/10434, Mar. 9, 2006.
International Search Report for International Application No. PCT/US2005/010432, date of mailing Sep. 27, 2005.
Written Opinion for International Application No. PCT/US2005/010432, date of mailing Sep. 2005.
Notification of Transmittal of International Preliminary Examination Report on Patentability, International Application No. PCT/US05/10432, date mailed Jun. 19, 2006.
International Search Report for International Application No. PCT/US2005/010431, date of mailing Sep. 27, 2005.
Written Opinion for International Application No. PCT/US2005/010431, date of mailing Sep. 2005.
International Preliminary Examination Report for International Application No. PCT/US2005/010431, Aug. 3, 2006.
Invitation to Pay Additional Fees for Application No. PCT/US2005/015606, date of mailing Nov. 18, 2005.
International Search Report and Written Opinion for International Application No. PCT/US2005/015606, date of mailing Feb. 24, 2006.
Declaration of Non-Establishment of International Search Report for International Application No. PCT/US03/21239, Nov. 5, 2003, 2 pages.
International Report on Patentability for International Application No. PCT/US03/21239, May 24, 2010.
Japanese Office Action, Japanese Application No. 2004-519985, Sep. 8, 2008, 9 pages.
Lanzoni et al., "A Novel Approach to Controlled Programming of Tunnel-Based Floating-Gate MOSFETs", 1994, IEEE Journal of Solid-State Circuits, vol. 29, pp. 147-150.
Ohsaki, et al., "A Single Poly EEPROM Cell Structure for Use in Standard CMOS Processes", IEEE Journal of Solid-State Circuits, vol. 29, No. 3, Mar. 1994, pp. 311-316.
Raszka, J., et al., "Embedded Flash Memory for Security Applications in a 0.13 µm CMOS Logic Process", IEEE 2004 International Solid-State Circuits Conference, Feb. 16, 2004, pp. 46-47.
Shi, Y. et al., "Polarity Dependent Gate Tunneling Currents in Dual-Gate CMOSFET's," IEEE Transactions on Electron Devices, Nov. 1998, pp. 2355-2360, vol. 45, No. 11.
Taiwan Office Action, Taiwan Application No. 092118353, Jul. 30, 2008, 6 pages.
Usuki, T. et al., "Direct Tunneling Memory: Trade-Off Between Nonvolatility and High-Endurance with Low Voltage Operations," Nonvolatile Semiconductor Workshop Symposium, Aug. 12, 2001, pp. 80-81.
Vittoz, E. "Dynamic Analog Techniques," Design of Analog-Digital VLSI Circuits for Telecommunications and Signal Processing, Second Edition, Chapter 4, 1994, pp. 97-124.
Witters, et al., "Analysis and Modeling of On-Chip High-Voltage Generator Circuits for Use in EEPROM Circuits", IEEE Journal of Solid-State Circuits, vol. 24, No. 5, Oct. 1989, pp. 1372-1380.
United States Office Action, U.S. Appl. No. 10/936,283, Nov. 8, 2006, 20 pages.
United States Office Action, U.S. Appl. No. 10/936,283, May 3, 2007, 18 pages.

United States Office Action, U.S. Appl. No. 11/731,228, Jul. 14, 2008, 7 pages.
United States Office Action, U.S. Appl. No. 11/731,228, Dec. 11, 2008, 8 pages.
United States Office Action, U.S. Appl. No. 10/813,907, Dec. 21, 2005, 12 pages.
United States Office Action, U.S. Appl. No. 10/813,907, Aug. 22, 2006, 8 pages.
United States Office Action, U.S. Appl. No. 10/813,907, Nov. 15, 2006, 3 pages.
United States Office Action, U.S. Appl. No. 10/814,866, Feb. 3, 2006, 26 pages.
United States Office Action, U.S. Appl. No. 10/814,866, Sep. 20, 2006, 19 pages.
United States Office Action, U.S. Appl. No. 10/814,866, Mar. 5, 2007, 19 pages.
United States Office Action, U.S. Appl. No. 10/814,866, Jul. 16, 2007, 18 pages.
United States Office Action, U.S. Appl. No. 10/814,866, Dec. 26, 2007, 12 pages.
United States Office Action, U.S. Appl. No. 10/814,868, May 3, 2006, 8 pages.
United States Office Action, U.S. Appl. No. 11/016,546, Mar. 12, 2007, 15 pages.
United States Office Action, U.S. Appl. No. 11/016,546, Aug. 6, 2007, 14 pages.
United States Office Action, U.S. Appl. No. 11/015,293, Apr. 4, 2007.
United States Office Action, U.S. Appl. No. 11/237,012, Jun. 28, 2007, 20 pages.
United States Office Action, U.S. Appl. No. 11/865,777, Jun. 24, 2009, 9 pages.
United States Office Action, U.S. Appl. No. 11/865,777, Jan. 14, 2010, 9 pages.
United States Office Action, U.S. Appl. No. 11/865,777, Aug. 3, 2010, 9 pages.
United States Office Action, U.S. Appl. No. 11/865,777, Mar. 31, 2011, 11 pages.
United States Office Action, U.S. Appl. No. 10/190,337, Jun. 17, 2003, 8 pages.
United States Office Action, U.S. Appl. No. 10/437,262, Jan. 11, 2005, 8 pages.
United States Office Action, U.S. Appl. No. 10/839,985, Nov. 29, 2005, 13 pages.
United States Office Action, U.S. Appl. No. 10/839,985, Aug. 25, 2006, 8 pages.
United States Office Action, U.S. Appl. No. 11/237,099, Oct. 2, 2006, 14 pages.
United States Office Action, U.S. Appl. No. 11/237,099, Mar. 9, 2007, 15 pages.
United States Office Action, U.S. Appl. No. 11/829,370, Feb. 10, 2009, 12 pages.
United States Office Action, U.S. Appl. No. 11/829,370, Sep. 25, 2009, 22 pages.
United States Office Action, U.S. Appl. No. 11/829,370, Apr. 1, 2010, 15 pages.
United States Office Action, U.S. Appl. No. 11/829,370, Sep. 2, 2010, 12 pages.

* cited by examiner

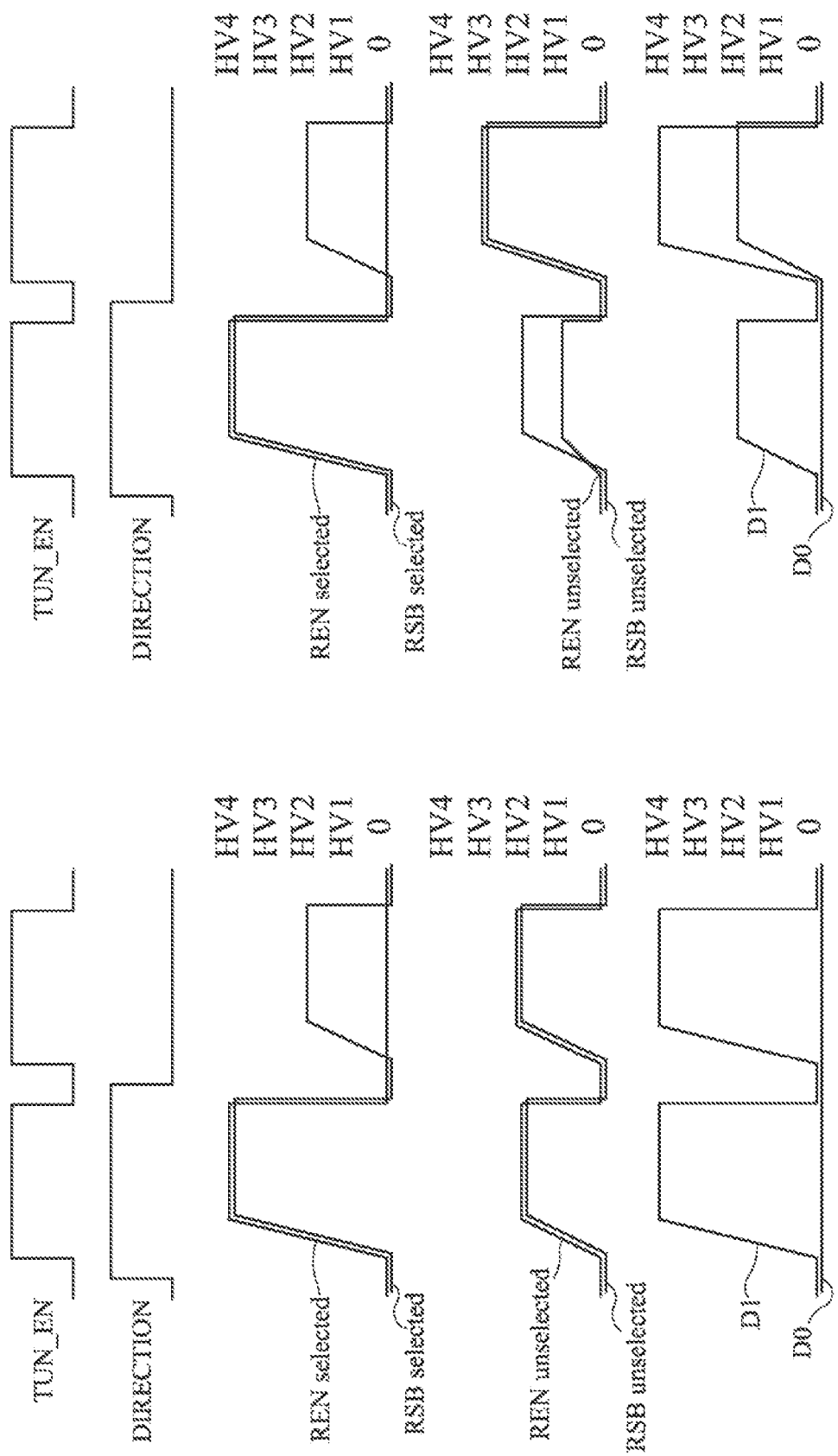

PFET NONVOLATILE MEMORY

CROSS-REFERENCE TO RELATED APPLICATIONS

This application is a continuation of, and claims priority to, U.S. patent application Ser. No. 12/239,696 now U.S. Pat. No. 7,894,261) entitled "PFET Nonvolatile memory," filed on Sep. 26, 2008, which claims priority under 35 U.S.C. §119(e) to U.S. Provisional Patent Application No. 61/055,368 entitled "Cell for Non-Volatile Memory," filed on May 22, 2008 and U.S. Provisional Patent Application No. 61/061,004 entitled "Cell for Non-Volatile Memory," filed on Jun. 12, 2008, which are incorporated by reference herein in their entirety.

FIELD OF THE INVENTION

The present invention relates generally to nonvolatile memory. More particularly, the present invention relates to single-ended and differential-type nonvolatile memory using floating-gate p-channel field effect transistors (pFETs) to store information as electric charge.

BACKGROUND OF THE INVENTION

Nonvolatile memory (NVM) is an important form of memory in today's electronic circuits. NVM is used to store serial number information, security information, settings, parameters, computer instructions (firmware), and the like. Reprogrammable NVM is particularly important, particularly in the field of tags such as RFID (radio frequency identification) tags which store information inexpensively and can be can be remotely sensed without the need to complete an actual circuit with the RFID tag itself. Such tags lack their own power supply and are powered instead by current rectified from a scanner's read-carrier RF signal received from an RFID reader/scanner.

OVERVIEW

A non-volatile memory integrated circuit includes multiple memory cells, each memory cell including a first MOS transistor, a first control capacitor, and a first floating gate coupled to the first MOS transistor and the first control capacitor. A first read/write control signal is provided having at least a first state and a second state and coupled the first MOS transistor. When the control signal is in the first state, the memory cell is configured for readout, and when the control signal is in the second state, the memory cell is configured for writing. Both single-ended and differential memory cells are described. Arrays of such nonvolatile memory cells are also described.

Other aspects of the inventions are described and claimed below, and a further understanding of the nature and advantages of the inventions may be realized by reference to the remaining portions of the specification and the attached drawings.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 10 is a waveform diagram illustrating write disturb during first and second phases.

FIG. 11 is a waveform diagram illustrating reduced write disturb during first and second phases.

DETAILED DESCRIPTION

Figure 1:
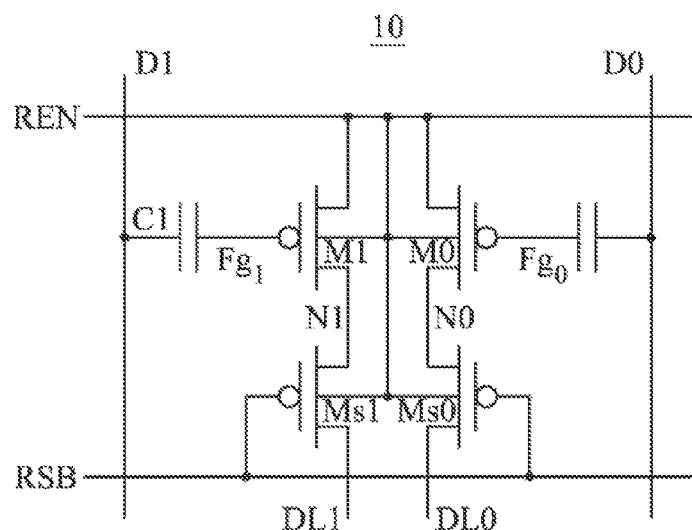
FIG. 1 is a schematic diagram of a non-volatile memory cell.

Embodiments of the present invention described in the following detailed description are directed at floating-gate nonvolatile memory cells having pFET readout transistors. Those of ordinary skill in the art will realize that the detailed description is illustrative only and is not intended to restrict the scope of the claimed inventions in any way. Other embodiments of the present invention, beyond those embodiments described in the detailed description, will readily suggest themselves to those of ordinary skill in the art having the benefit of this disclosure. Reference will now be made in detail to implementations of the present invention as illustrated in the accompanying drawings. Where appropriate, the same reference indicators will be used throughout the drawings and the following detailed description to refer to the same or similar parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming.

but would nevertheless be a routine undertaking of engineering for those of ordinary skill in the art having the benefit of this disclosure.

As used herein, the symbol n+ indicates an n-doped semiconductor material typically having a doping level of n-type dopants on the order of $10^{21}$ atoms per cubic centimeter. The symbol n− indicates an n-doped semiconductor material typically having a doping level on the order of $10^{17}$ atoms per cubic centimeter. The symbol p+ indicates a p-doped semiconductor material typically having a doping level of p-type dopants on the order of $10^{21}$ atoms per cubic centimeter. The symbol p-indicates a p-doped semiconductor material typically having a doping level on the order of $10^{17}$ atoms per cubic centimeter for p-wells and a doping level on the order of $10^{15}$ atoms per cubic centimeter for p-substrate material. Those of ordinary skill in the art will now realize that the devices described herein may be formed on a conventional semiconductor substrate or they may as easily be formed as a thin film transistor (TFT) above the substrate, or in silicon on an insulator (SOI) such as glass (SOG), sapphire (SOS), or other substrates as known to those of ordinary skill in the art. Such persons of ordinary skill in the art will now also realize that a range of doping concentrations around those described above will also work. Essentially, any process capable of forming pFETs and nFETs will work. Doped regions may be diffusions or they may be implanted.

A number of circuits that may be used as NVM cells and arrays for such cells are described in detail below. These NVM circuits are able to store information by modifying a charge (i.e., by adding or removing electrons) stored on a floating gate of one or more pFET transistors. In digital implementations, the state (i.e., either a "1" or a "0") of the memory cell is read by measuring the current of some of the pFETs in the circuit. The use of pFETs instead of nFETs (n-channel FETs) offers better data retention, higher endurance and requires no additional processing steps beyond what is available in standard logic CMOS processes. Obviously, if desired, these circuits can be fabricated in as complicated a process as desired, however, they are all capable of being fabricated in single-poly (single layer of polysilicon) logic CMOS processes as supported by virtually all semiconductor foundries operating today. Conventional FLASH and EEPROM NVM require special process steps beyond those of logic CMOS and are, consequently, harder and more expensive to fabricate. Applications that require up to several kilobytes of NVM on the same chip with other circuitry and/or require low cost fabrication are ideal candidates for the circuits discussed herein.

Turning now to FIG. 1, a basic differential pFET NVM memory cell 10 is illustrated, This cell has two floating gates denoted $Fg_0$ and $Fg_1$. By storing a different amount of electrons on the two floating gates it is possible to establish a voltage differential between the two floating gates. When a suitable voltage is applied to the signal line denoted "REN," signals are read out on data lines DL1 and DL0 that may be used to discern the logic value stored in the cell. For example, a difference in the readout currents may be present and a sense amplifier such as a conventional current sense amplifier (not shown) may consequently be used to discern the logic value stored in the cell. Readout transistors Ms1 and Ms0 are coupled in series with the transistors M1 and M0, respectively, for this purpose. One channel electrode of the transistor Ms1 is connected to a channel electrode of the transistor M1 at a node N1. A gate electrode of the transistor Ms1 is connected to a signal line RSB. Similarly, one channel electrode of the transistor Ms0 is connected to a channel electrode of the transistor M0 at a node N0. A gate electrode of the transistor Ms1 is also connected to the signal line RSB.

As shown in FIG. 1, a capacitor C1 and a transistor M1 have floating gate $Fg_1$ in common. A capacitor C0 and a transistor M0 have floating gate $Fg_0$ in common. The signal line REN is the voltage terminal for the transistors M1 and M0; a signal line D1 is the voltage terminal for the capacitor C1; and a signal line D0 is the voltage terminal for the capacitor C0. The capacitors C1 and C0 may be realized as shorted pFETs having their source, drain and well connections are all tied together. The capacitors C1 and C0, which are used as control capacitors, may instead be constructed as poly-poly, or poly-metal capacitors. Metal-metal capacitors can also be used for the control capacitor structures, although with existing fabrication processes this would reduce the memory retention time due to leakage from the poly contact and the metal inter-layer dielectric. The transistors M1 and M0 and the capacitors C1 and C0 may also be constructed using other types of transistors, such as nFETs. By applying the appropriate voltages to terminals signal lines REN. D1 and D0, a sufficiently large electric field can be established across the oxide dielectric of the pFETs M1 or M0 connected to respective floating gates $Fg_0$, $Fg_1$ so that the well-known mechanism of Fowler-Nordheim (FN) tunneling may be used to pass electrons through the oxide dielectric of the transistors M1 or M0.

When the memory cell of FIG. 1 is used to form a memory array organized in rows and columns, the signals lines REN and RSB may be common for a given row. The signals lines D1 and D0 and DL1 and DL0 may be common for a given column.

In order to establish a large electric field across one of the pFETs' oxides, the capacitors C1 and C0 should be made sufficiently large to acts as control capacitors for the respective floating gates $Fg_0$, $Fg_1$, as described, for example, in U.S. Pat. No. 7,221,596.

The process for adding and removing electrons from a floating gate Fg may be understood with reference to the following Table I, wherein X signifies a "don't care" condition and N/A signifies "not applicable:"

TABLE I

| Condition | DIRECTION | REN | RSB | D1 | D0 | FG1 | FG0 | BIASING |
|---|---|---|---|---|---|---|---|---|
| IDLE | X | VDD | VDD | 0 | 0 | X | X | N/A |
| READ unselected | X | VDD | VDD | 0 | 0 | X | X | N/A |
| READ selected | X | VDD | 0 | 0 | 0 | X | X | N/A |
| WRITE unselected | X | HV2 | HV2 | X | X | Unchanged | unchanged | X |
| WRITE "1" | 1 | HV4 | HV4 | HV4 | 0 | Unchanged | Removing e- | R(1) |
| WRITE "1" | 0 | 0 | HV2 | HV4 | 0 | Adding e- | unchanged | A(1) |
| WRITE "0" | 1 | HV4 | HV4 | 0 | HV4 | Removing e- | unchanged | R(0) |
| WRITE "0" | 0 | 0 | HV2 | 0 | HV4 | Unchanged | Adding e- | A(0) |

In an IDLE condition, the signal lines REN and RSB are set to VDD, and the signal lines D1 and D0 are set to 0. The same is true of a READ unselected condition in which a read operation is performed but on a different cell than the current cell. To read the contents of the current cell, the signal line RSB is set to 0, causing the transistors Ms1 and Ms0 of FIG. 1 to conduct.

Figure 2A:
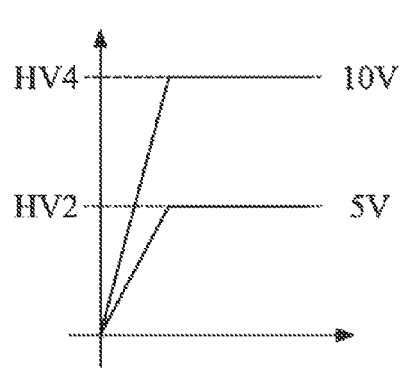
FIG. 2A is a waveform diagram showing waveforms used to access the non-volatile memory cell.

In a WRITE unselected condition, the signal line REN and the signal line RSB are set to a voltage HV2 as illustrated in FIG. 2A. The charge on the floating gates $Fg_0$, $Fg_1$, remains unchanged.

Of particular interest are the bottom four rows of TABLE I, shaded in gray. A WRITE "1" condition has two different directions associated with it, designated (arbitrarily) DIRECTION 1 and DIRECTION 0. During a WRITE "1" DIRECTION 1 operation, charged is removed from the floating gate $Fg_0$, while the charge condition of the floating gate $Fg_1$ remains unchanged. This is accomplished by setting the signals lines REN, RSB and D1 to a voltage HV4 as illustrated in FIG. 2A, and setting the signal line D0 to 0. This biasing condition is designated as R(1), indicating that charge is being removed incident to writing a "1" value. During a WRITE "1" DIRECTION 0 operation, charged is added to the floating gate $Fg_1$, while the charge condition of the floating gate $Fg_0$ remains unchanged. This is accomplished by setting the signals line RSB to the voltage HV2 and the signal line D1 to the voltage HV4 as illustrated in FIG. 2A, and setting the signal lines REN and D0 to 0. This biasing condition is designated as A(1), indicating that charge is being added incident to writing a "1" value. The writing of a "1" is complete when both the WRITE "1" DIRECTION 1 operation and the WRITE "1" DIRECTION 0 operation, which are performed in succession, have been completed at least one time and preferably multiple times as described more fully hereinafter.

To write a "0," the WRITE "0" DIRECTION 1 operation and the WRITE "0" DIRECTION 0 operation are performed in succession under the bias conditions R(0) and A(0), as indicated in TABLE 1. During the WRITE "0" DIRECTION 1 operation, charge is removed from the floating gate $Fg_1$, while the charge condition of $Fg_0$ remains unchanged. During the WRITE "0" DIRECTION 0 operation, charge is removed from the floating gate $Fg_0$, while the charge condition of $Fg_1$ remains unchanged.

Note in TABLE 1 that the signal line REN applied to the channel electrodes of the transistors M1 and M0 is not constant but rather is set to various different values depending on the operation being performed (for READ operations, VDD; for WRITE operations, 0, HV2 or HV4). The signal on REN is therefore referred to at times herein as a "read/write control signal."

The particular voltage values in the example of FIG. 2A are intended to be just an example. The real values will depend upon various factors such as oxide thickness and quality, desired program time, endurance and retention requirements, and the fabrication process used and are well within the skills of those of ordinary skill in the art having the benefit of this disclosure.

Figure 3:
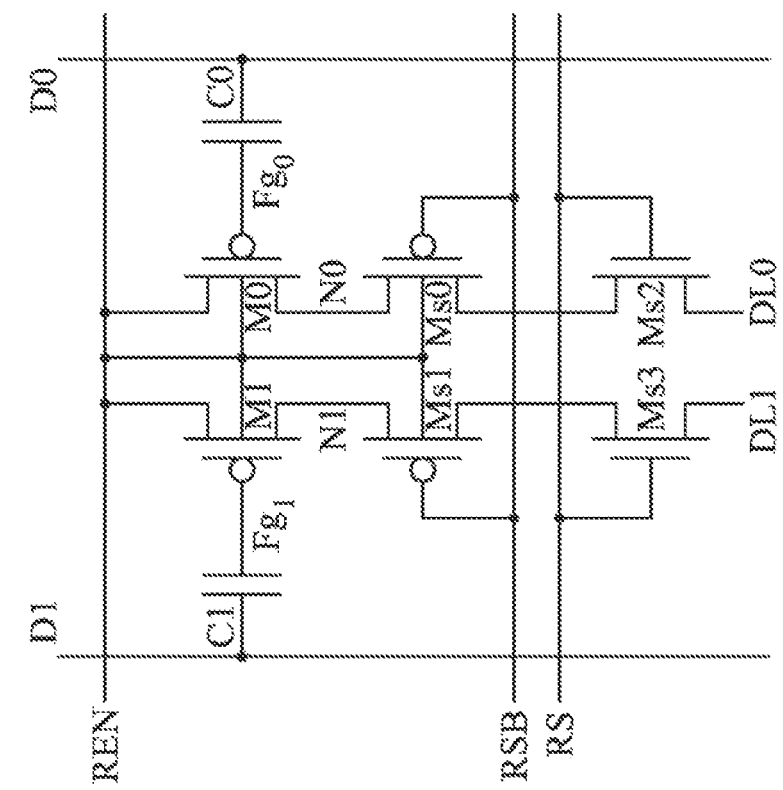
FIG. 3 is a schematic diagram of another non-volatile memory cell.

The transistors Ms1 and Ms0 of FIG. 1, shown as pFETs, can be pFETs or nFET with high voltage capabilities (such as native drain nFETs). High voltage capability is needed in the embodiment described because when REN is high, these transistors have high voltage placed on their drain electrodes. In some embodiments, additional transistors may be provided to alleviate the potential diode breakdown problem from the source electrodes of the transistors MS1 and MS0 to the drain lines DL1 and DL0. One such arrangement is illustrated in FIG. 3, in which transistors Ms3 and Ms2 are coupled in series with the transistors Ms1 and Ms0, respectively. A signal line RS is provided that carries the logical inverse value of the signal carried by the signal line RSB and is coupled to gate electrodes of the transistors Ms3 and Ms2.

Figure 4:
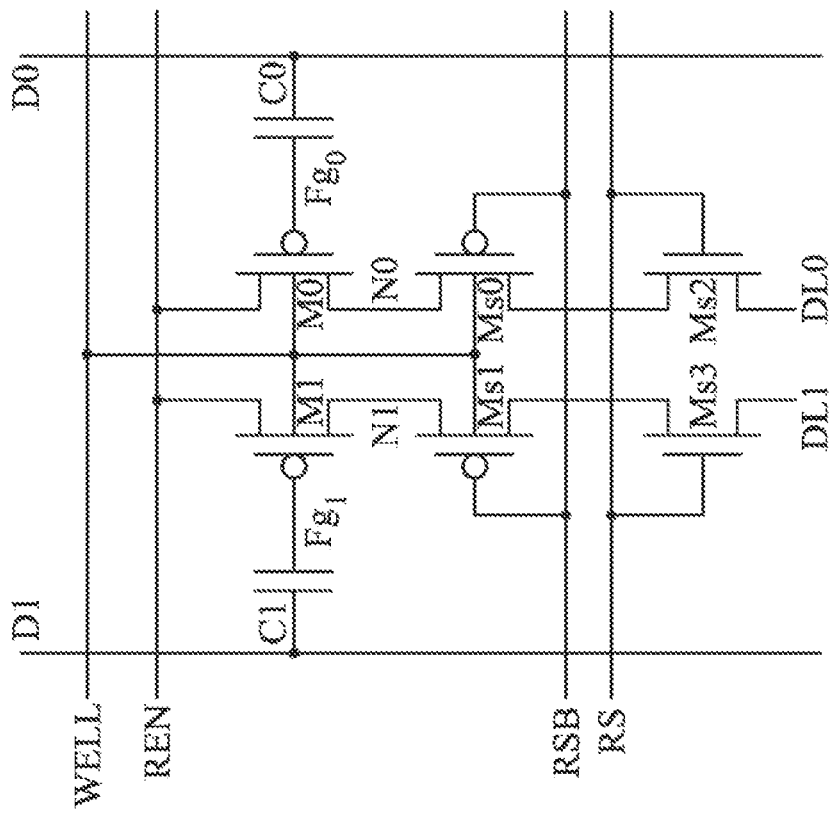
FIG. 4 is a schematic diagram of a further non-volatile memory cell.

Improved idle disturb performance (disturbance of the charge conditions of floating gate electrodes during the IDLE condition) may be achieved by providing a separate WELL signal line coupled to the well electrodes of the transistors M1, M0, Ms1 and Ms0. This arrangement is illustrated in FIG. 4. The difference between the cell of FIG. 4 and the cell of FIG. 1 is that the well of at least some of the FET devices is not controlled directly by signal REN, but from a different signal (WELL) in the FIG. 4 embodiment. This permits more freedom in the choice of biasing condition during various states of operation. In the embodiment of FIG. 4, the REN and RSB signals are common for a given row of an array of like memory cells; the D1 and D0 signals are common for a given column of like memory cells and the WELL signal can be shared by all like memory cells in the array.

The described cells may be operated in differential fashion or single-ended fashion as described in greater detail hereinafter. Differential memory cell operation is advantageous because it allows the doubling of the storage window as compared to a single-ended memory cell. A single-ended approach, on the other hand, has the benefit of reducing by approximately half the number of transistors in the memory cell thus providing an advantage with respect to the differential version in terms of area and cost. Differential memory is particularly advantageous in situations where reliable reference voltage sources are not readily available, such as in portable devices, remotely powered devices (such as RFiD tags and security cards), and the like.

Figure 5A:
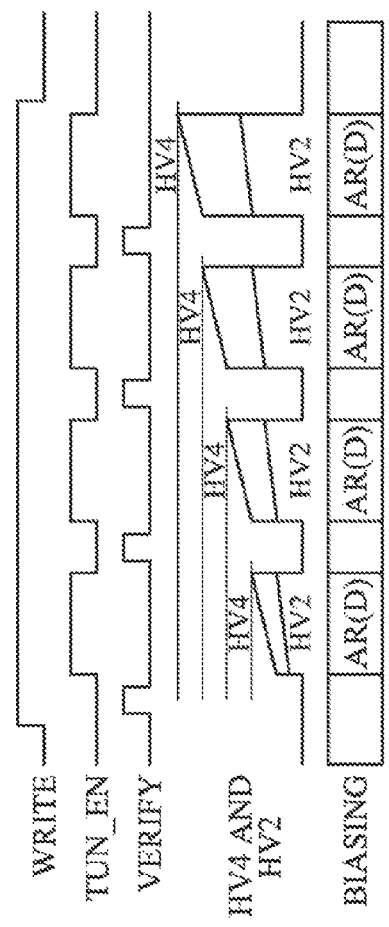
FIG. 5A is a waveform diagram illustrating waveforms used to write a known non-volatile memory cell.
Figure 5B:
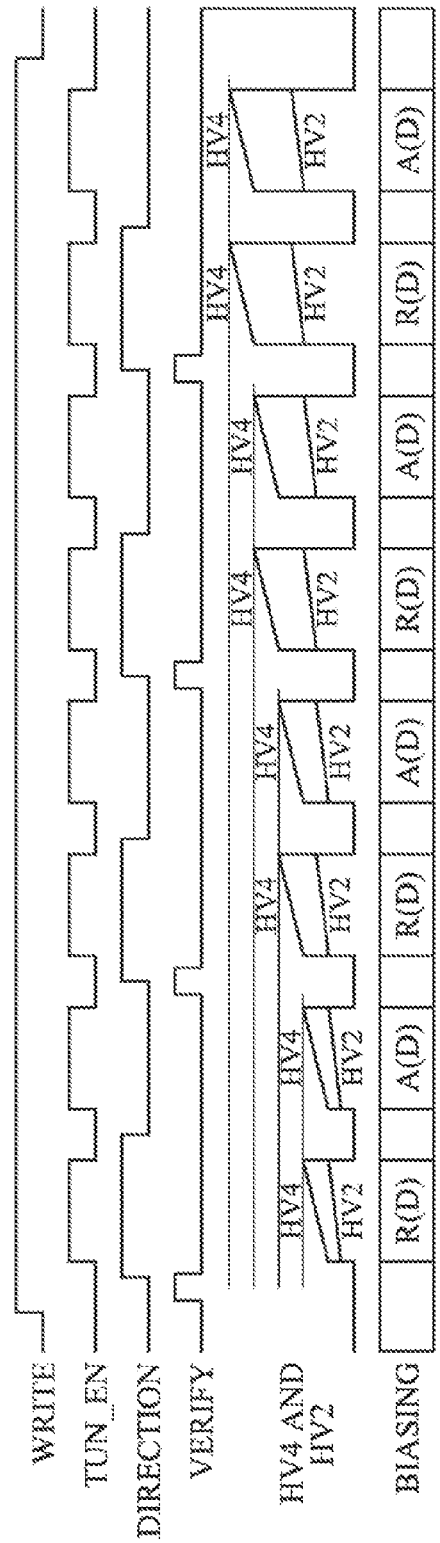
FIG. 5B is a waveform diagram illustrating waveforms used to write the non-volatile memory cell of FIG. 1.

FIGS. 5A and 5B compare a write cycle of one known non-volatile memory cell with a write cycle that may be used with the non-volatile memory cell of FIG. 1. In the case of the known non-volatile memory cell, during the course of the write cycle, verify cycles (which involves applying the high-voltage until a read operation on the memory cell reports that the desired logic value is stored in the cell) and tunneling enable cycles are alternated for total of, in the illustrated embodiment, four verify cycles and four tunneling enable cycles. During tunneling enable cycles, biasing values are place on the signal lines of the cells, including the voltage values HV2 and HV4.

For technical reasons (to avoid overstressing the oxide with excess tunneling current) and practical reasons (limitation of the charge pump supplying the high-voltage) the high-voltage applied to program the cell is not held constant but rather is applied with a ramp-like profile. It is possible to perform a timed program operation where the high-voltage is applied for a certain amount of time that is deemed sufficient to tunnel the right amount of charge to and from the floating gates. This can be problematic where transistors are not precisely identical throughout an array or chip as size or conductivity differences may lead one cell to require a longer amount of time to achieve the same state as another cell. Another approach involves applying the high-voltage until a read operation on the memory cell reports that the desired logic value is stored in the cell, This does not pose any technical problems because the time it takes to read the cells is much less than the time it takes to write them.

During writing of the known memory cell as illustrated in FIG. 5A, because the cell is of a more complex construction, during a tunneling enable operation, charge is both added to and removed from opposite ones of the floating gates $Fg_0$, $Fg_1$ as a function of the data value being written. This simultaneous addition and removal of charge as a function of the data value being written is indicated in FIG. 5A as "AR(D)." That is, Addition of charge & Removal of charge (as a function of Data) is abbreviated as AR(D).

During writing of the memory cell of FIG. 1 as illustrated in FIG. 5B, because the cell is of simpler construction, during a tunneling enable operation, charge is either added to or removed one of the floating gates $Fg_0$, $Fg_1$ as a function of the data value being written. This alternating addition and removal of charge as a function of the data value being written is indicated in FIG. 5B as "A(D)" and "R(D)," respectively.

In certain RFiD applications of the memory cell (such as in-line testing) WRITE speed is very important. In these applications, a writing of an Electronic Product Code (EPC) might be required to be completed within a maximum of 10 ms, for example. For the same ramp rate (i.e. oxide stress) the WRITE time is double in FIG. 5B as compared to FIG. 5A (2*N tunneling pulses compared to only N). In instances where all of the bits of a word of data are written simultaneously, one way to increase WRITE speed is to increase (i.e, double) the word size (e.g., 16 bits→32 bits).

Figure 6:
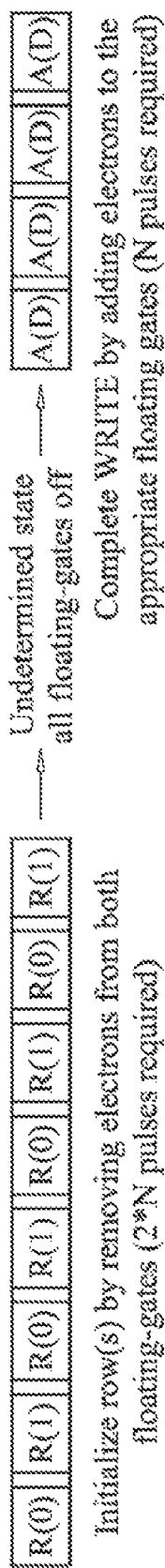
FIG. 6 is a diagram representing one manner of write pre-initialization.
Figure 7:
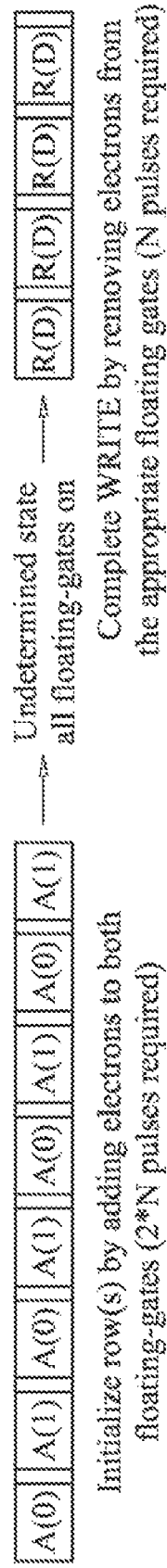
FIG. 7 is a diagram representing another manner of write pre-initialization.

Another way to increase WRITE speed is to re-initialize EPC rows at wafer production such that only one-step writing is required in the field, as illustrated in FIGS. 6 and 7. In FIG. 6, rows are initialized at the manufacturing stage by removing electrons from both of the floating gates of each cell. This is accomplished by performing the operations R(0) and R(1) in succession (at least once, and preferably multiple times) for each memory cell. As a result, each memory cell is placed in an undetermined state in which all floating gates are "off" (i.e., in a minimum-charge state). In the field, a WRITE may be performed by simply adding electrons to the appropriate floating gates, by performing the operation A(D). Alternatively, as illustrated in FIG. 7, during initialization, all of the floating gates may be placed in the "on" condition (i.e., in a maximum-charge state). In the field, a WRITE may be performed by simply removing electrons from the appropriate floating gates, by performing the operation R(D).

Figure 8A:
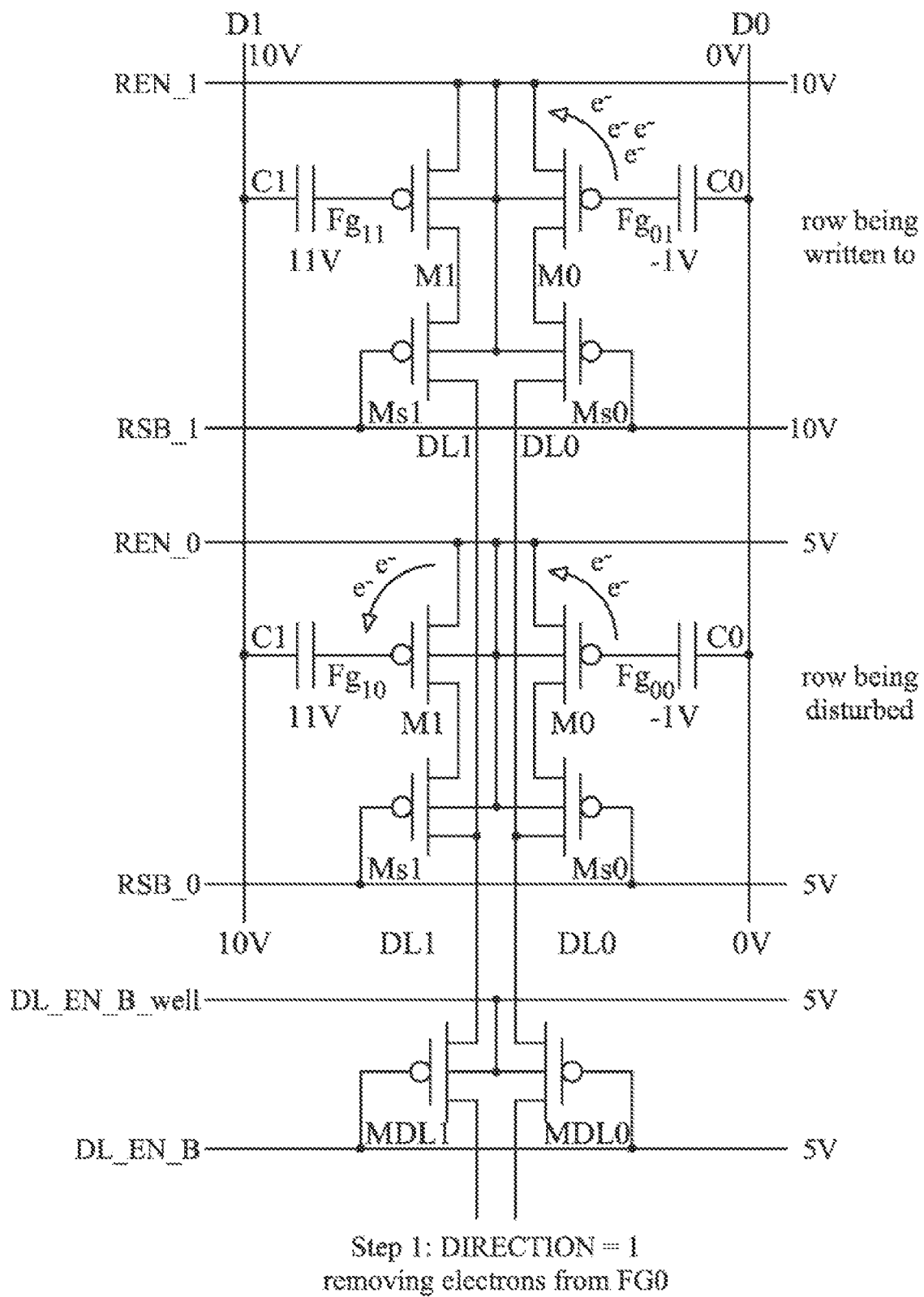
FIG. 8A is a diagram illustrating write disturb during a first write phase.

With the row-select transistors Ms1 and Ms0 embedded in the nonvolatile memory cells it is possible to array the cells in a row-column configuration. A simple configuration of a single column of two memory cells is depicted in FIG. 8A. Additional readout circuit for the column is provided in the form of transistors MDL1 and MDL0 and signals lines DL_ENhB and DL_EN_B well.

In the array of NVM cells depicted in FIG. 8A, column control signals comprise the data inputs referred to as D1 and D0 for the cell; row control signals comprise the row enable signals REN_1 and REN_0 and the row select signals RSB_1 and RSB_0. Other control signals may be also used, depending on the particular implementation.

In FIG. 8A, if the upper row (or cell) is being written to, a phenomenon may occur that is referred to as write disturb—changing of an already-programmed cell contents while writing a different cell. FIG. 8A illustrates the phenomenon of write disturb during a WRITE "1" DIRECTION 1 operation in which electrons are removed from the floating gate $Fg_{01}$. For voltages HV2 and/or HV4 (which may exhibit a ramping behavior), voltage values are illustrated that correspond to final voltage values. With the floating gate $Fg_{01}$ of the top row at −1V (for example) and the signal line REN_1 at 10V (for example), considerable removal of charge from the floating gate $Fg_{01}$ occurs. However, with the floating gate $Fg_{00}$ of the bottom row at −IV (for example) and the signal line REN_0 at 5V (for example), removal of charge from the floating gate $Fg_{00}$ also occurs, though reduced as compared to the removal of charge from the floating gate $Fg_{01}$. Also, with the floating gate $Fg_{10}$ of the bottom row at 11V (for example) and the signal line REN_0 at 5V, addition of charge to the floating gate $Fg_{10}$ also occurs, though reduced as compared to the removal of charge from the floating gate $Fg_{01}$.

Figure 8B:
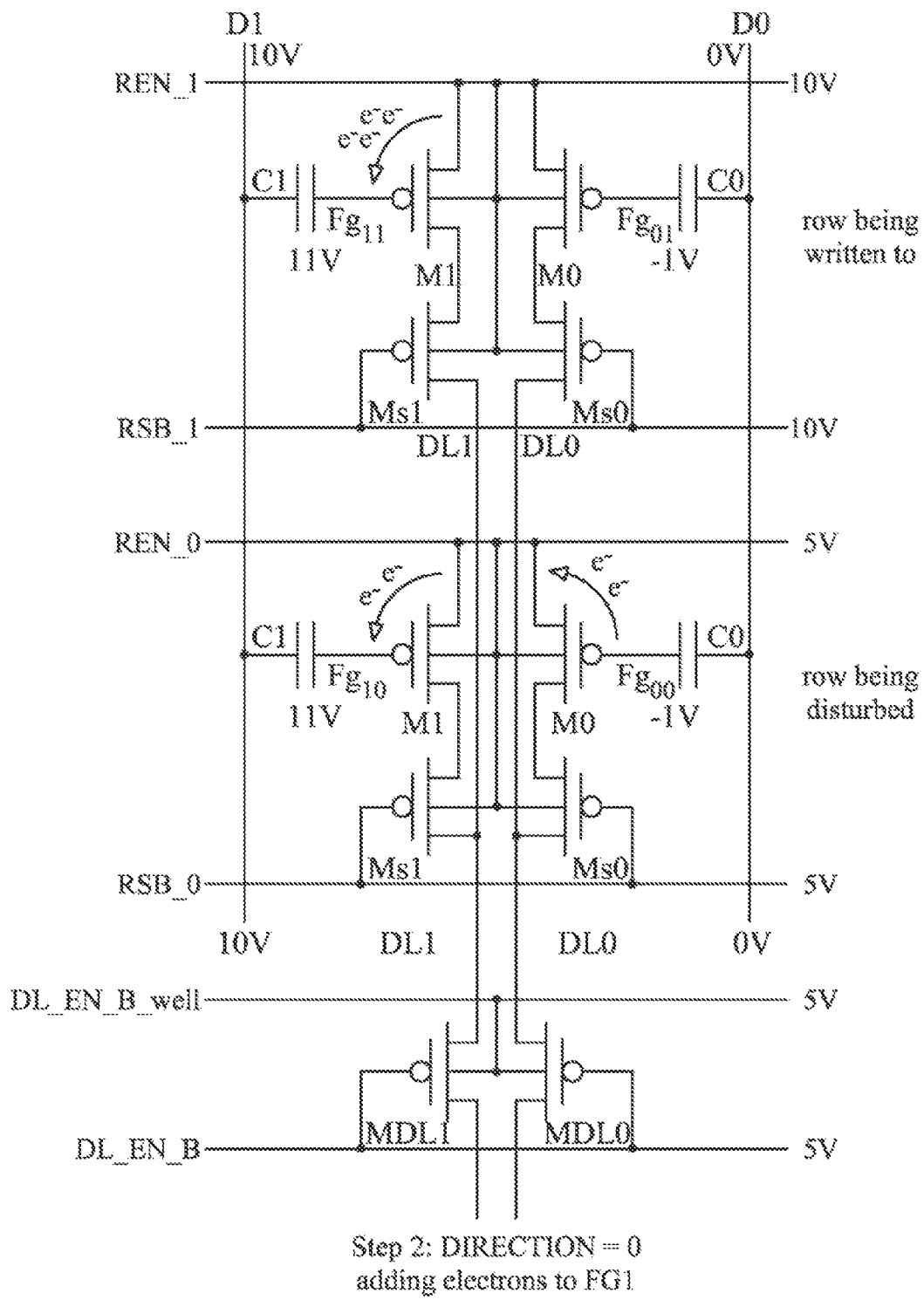
FIG. 8B is diagram illustrating write disturb during a second write phase.

FIG. 8B illustrates the phenomenon of write disturb during a WRITE "1" DIRECTION 0 operation in which electrons are added to the floating gate $Fg_{11}$. During this operation, write disturb also occurs, in the same manner as described in relation to FIG. 8A.

Figure 9A:
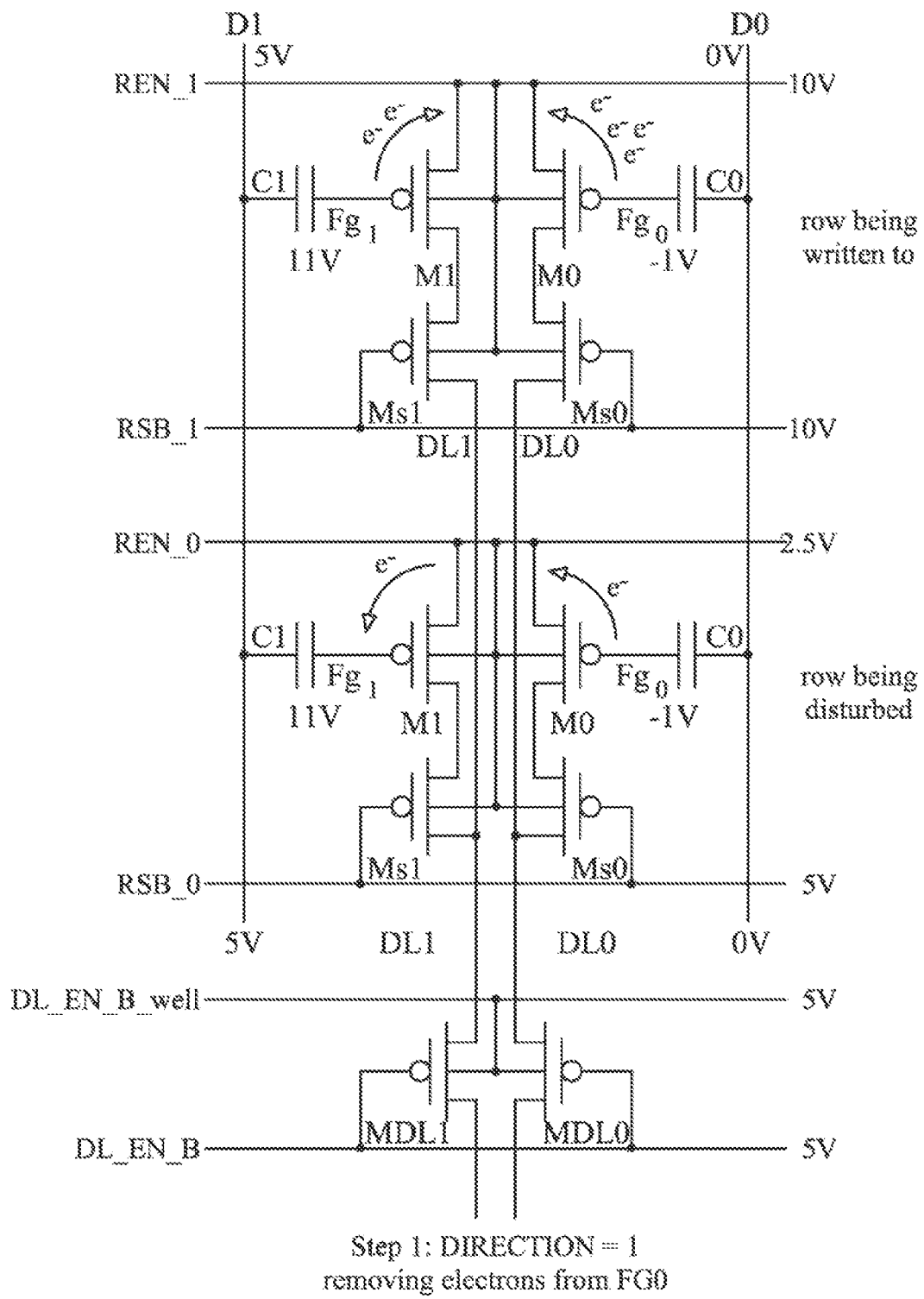
FIG. 9A is diagram illustrating reduced write disturb during a first write phase.
Figure 9B:
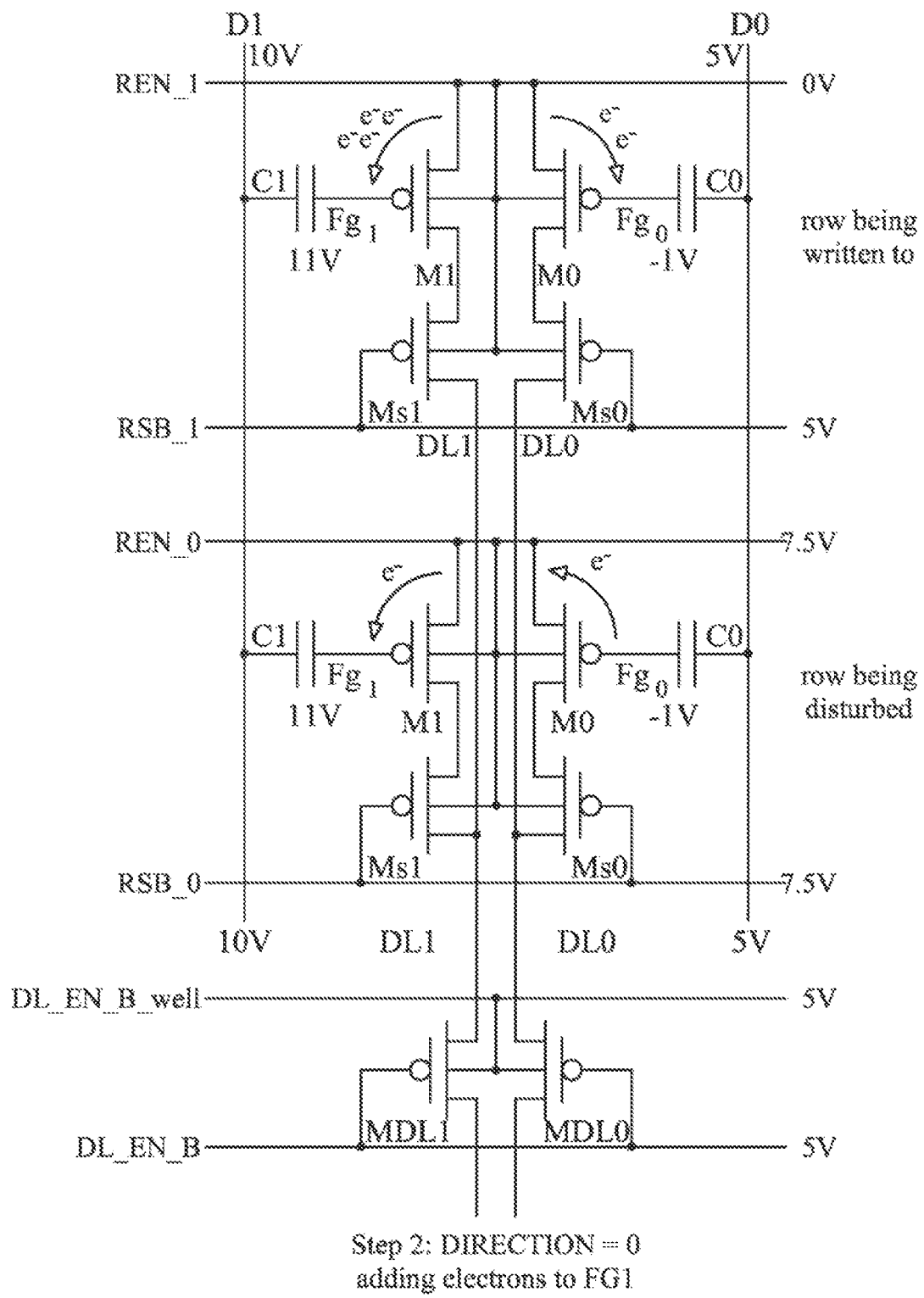
FIG. 9B is diagram illustrating reduced write disturb during a second write phase.

Referring to FIGS. 9A and 9B, write disturb may be reduced by, among other things, controlling the signal line REN of rows not being written to as a function of voltage values applied to the column signals lines D1 and D0. In one embodiment, the signal line REN of rows not being written to is controlled so as to carry a voltage value approximately (with a tolerance of 25%, for example) midway between the voltage values applied to the column signal lines D1 and D0. In FIG. 9A, with the voltage values of 5V and 0V being applied to the column signal lines D1 and D0, the signal line REN_0 is controlled so as to carry a voltage value of approximately 2.5V. In FIG. 9B, with the voltage values of 10V and 5V being applied to the column signal lines D1 and D0, the signal line REN_0 is controlled so as to carry a voltage value of approximately 7.5V. Write disturb is thereby reduced.

Various combined measures used to reduce write disturb, including controlling the signal line REN in the foregoing manner, are represented in TABLE II below:

TABLE II

| Condition | DIR | REN I | REN II | RSB I | RSB II | D1 I | D1 II | D0 I | D0 II |
|---|---|---|---|---|---|---|---|---|---|
| WRITE unselected | I | HV2 | HV1 | HV2 | HV2 | X | X | X | X |
| WRITE unselected | 0 | HV2 | HV3 | HV2 | HV3 | X | X | X | X |
| WRITE "1" | 1 | HV4 | HV4 | HV4 | HV4 | HV4 | HV2 | 0 | 0 |
| WRITE "1" | 0 | 0 | 0 | HV2 | HV2 | HV4 | HV4 | 0 | HV2 |
| WRITE "0" | 1 | HV4 | HV4 | HV4 | HV4 | 0 | 0 | HV4 | HV2 |
| WRITE "0" | 0 | 0 | 0 | HV2 | HV2 | 0 | HV2 | HV4 | HV4 |

Figure 2B:
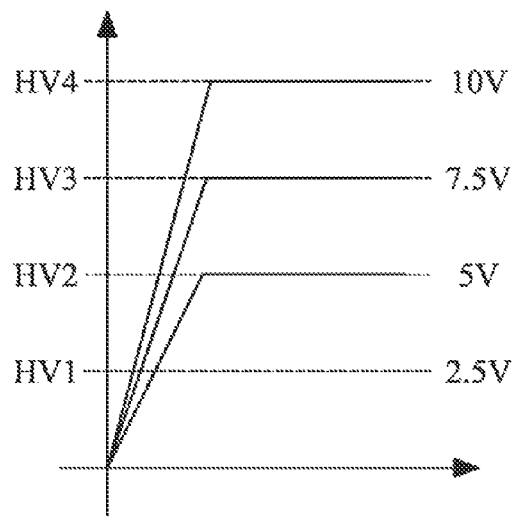
FIG. 2B is a waveform diagram showing waveforms used to access the non-volatile memory cell in another embodiment.

The effect of the improved biasing arrangement of FIGS. 9A and 9B is illustrated in FIGS. 10 and 11 during a sequence of a WRITE "1" DIRECTION 1 operation followed by a WRITE "1" DIRECTION 0 operation. The voltages HV1-HV4 may be chosen as shown in FIG. 2B, for example, in the center portion of the respective figures are shown voltage on the signals lines REN and RSB for the selected cell and for the unselected cell. In FIG. 10, without improved biasing, when REN and RSB of the unselected cell are at HV2 (e.g., 5V) and the signal line D1 is at HV4 (e.g., 10V), the disturb voltage is HV4/2 (e.g., 5V). In FIG. 11 with improved biasing, the disturb voltage is HV4/4 (e.g., 2.5V).

Figure 12:
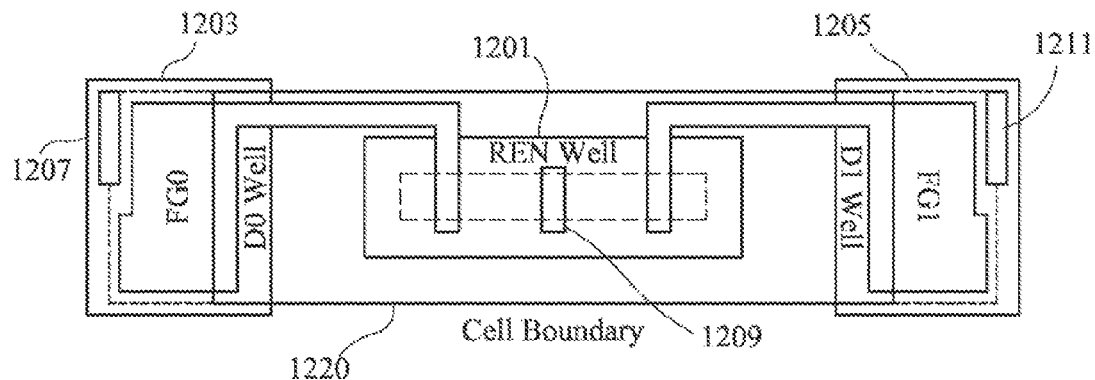
FIG. 12 is a diagram of one possible layout of the memory cell of FIG. 1.
Figure 13:
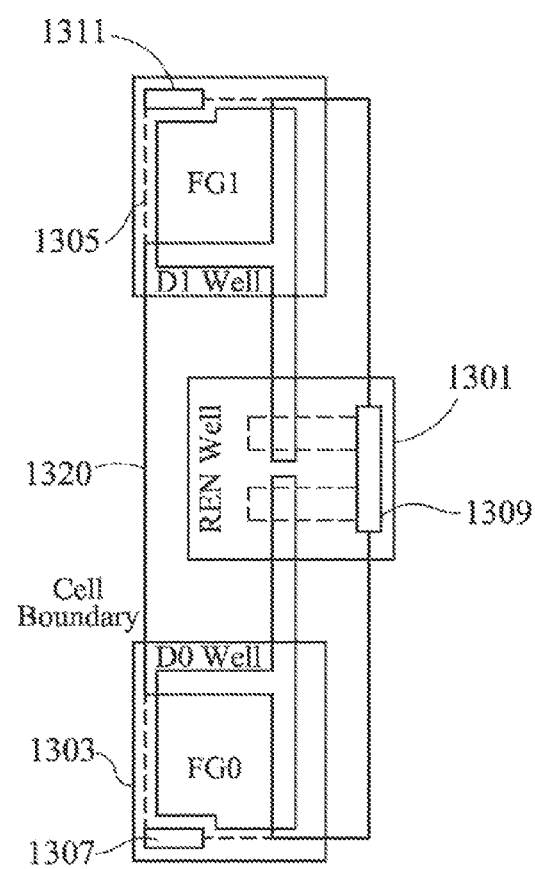
FIG. 13 is diagram of another possible layout of the memory cell of FIG. 1.

Because the present memory cell has only three wells, various cell layout possibilities are enabled that result in a more compact array layout. Two such possibilities are illustrated in FIG. 12 and FIG. 13, respectively. In FIG. 12, the cell is laid out horizontally, one floating gate well (e.g., a D0 well 1203 corresponding to a floating gate FG0) on the left and the other floating gate well (e.g., a D1 well 1205 corresponding to a floating gate FG1) on the right, with a REN well 1201 in the center. Respective contacts 1207, 1209 and 1211 contact the wells 1203, 1201 and 1205. A cell boundary 1220 determines how the cell is tiled to form an array of cells. When the cell is tiled, structures outside the cell boundary overlap with corresponding structures associated with neighboring cells such that the overlapping structures are shared. In FIG. 12, the cell is laid out vertically. The cell is assymetrical, with the floating gate wells 1303 and 1305 offset to one side of center, and the REN well 1301 offset to the opposite side of center.

Figure 14:
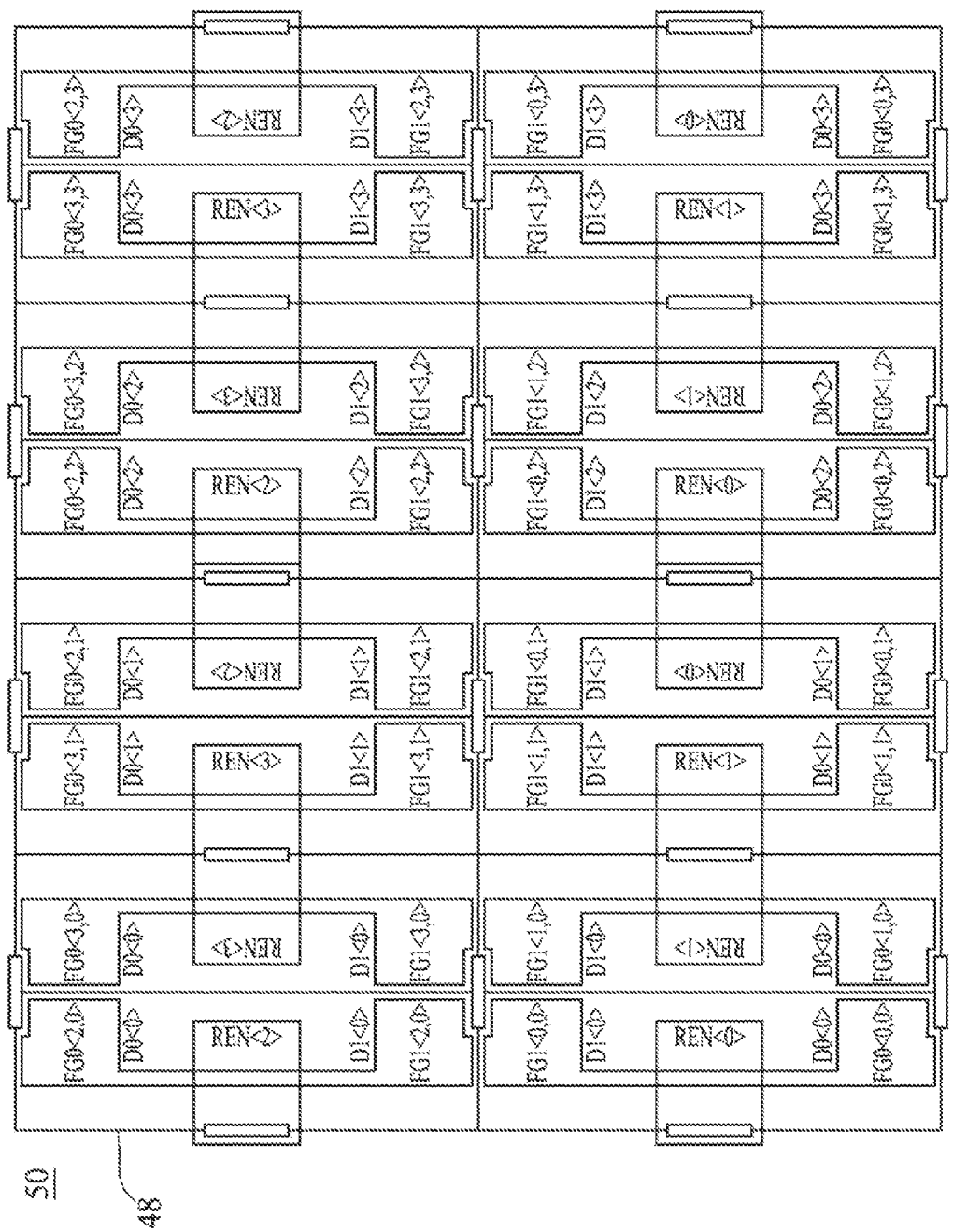
FIG. 14 is a diagram of a differential memory array using the cell layout of FIG. 13.

Turning now to FIG. 14, an array 50 of NVM cells 48 is depicted which may operate in accordance with the voltages stated in Table II above. Smaller minimum feature sizes and reduced oxide thickness may reduce these voltage requirements somewhat. The array takes advantage of the asymmetry of the cell of FIG. 13 to achieve a compact layout. In this array 50 the REN signal is common for a given row while D1 and D0 timeshare a single line and are common for a given column, Sense amplifiers (or equivalent readout circuitry) is provided for each column and reads the output currents for the selected row.

In FIG. 14, each of the floating gates is number with an index having a first value corresponding to the number of a REN line used to read information from that floating gate and a second number corresponding to the number of a D1/D0 line used to write information to that floating gate. In the case of the cell 48, for example, the upper left floating gate FG<2, 0> is so labeled because a REN<2> line is used to read information from that floating gate and a D1/D0<0> line is used to write information to that floating gate. Note that cells that would ordinarily belong to different rows are arrayed within the same row in alternating fashion. In the top row therefore, REN<2> cells and REN<3> cells are alternated. The resulting layout is more compact than other layouts that do not take advantage of this possibility.

Figure 15:
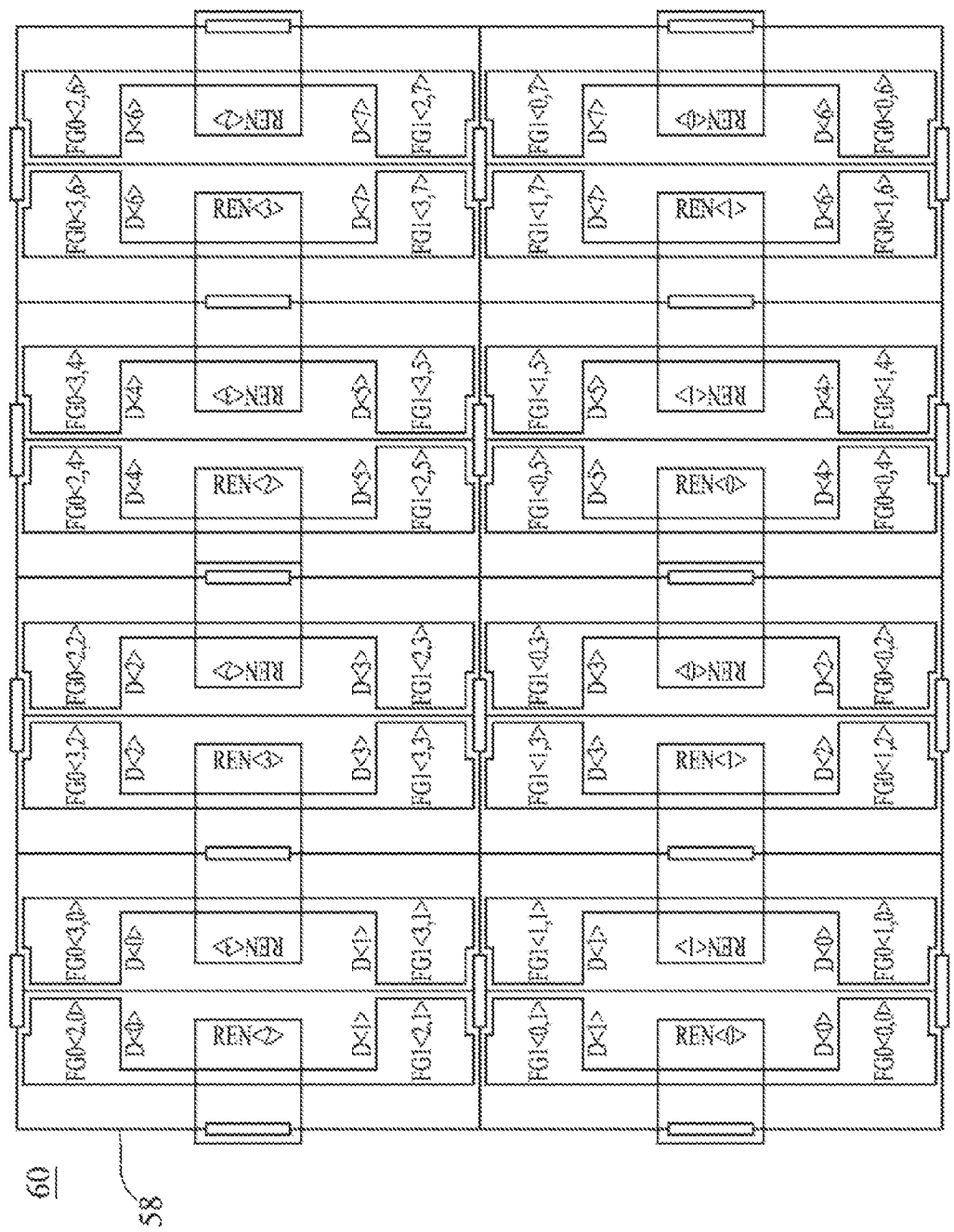
FIG. 15 is a diagram of a single-ended memory array using the cell layout of FIG. 13.

Turning now to FIG. 15, a similar array 60 of NVM cells 58 is depicted which may operate in accordance with the voltages stated in Table II above. Whereas the array of FIG. 14 is assumed to be operated differentially, the array of FIG. 15 is assumed to be operated in single ended fashion. The columns lines therefore, instead of being labeled in terms of D1 and D0 (denoting differential data), are labeled simply D, No physical change in the layout is required.

A method of operating the cells described herein includes applying the voltage signals set forth in exemplary TABLE I or exemplary TABLE II to the a cell like that of FIG. 1, FIG. 3 or FIG. 4. The voltages are typically developed on chip using charge pumps for minimum size. Charge pumps may provide static voltages, or, more effectively, ramped voltages as are well known to those of ordinary skill in the art. In accordance with the claims set forth below, the "biasing" may be achieved with the control capacitor structure. The "charging" and "discharging" may be achieved with the tunneling capacitor structure to achieve Fowler-Nordheim tunneling. Note that the voltages set forth in TABLE I and TABLE II are exemplary voltages for use with devices built in a 0.18 micron minimum feature size logic CMOS fabrication process technology. As technology improves, minimum feature sizes steadily decrease until some possible fundamental physical limit is ultimately reached. As these sizes decrease, the voltages used will also decrease as the same electric field can be achieved with a smaller voltage over a correspondingly smaller distance. Thus, the voltages set forth in TABLE I and TABLE II are examples only and those of ordinary skill in the art will now realize that other voltages may be used where appropriate for the process technology used to fabricate the memory cells.

While embodiments and applications of this invention have been shown and described, it will now be apparent to those skilled in the art having the benefit of this disclosure that many more modifications than mentioned above are possible without departing from the inventive concepts disclosed herein. Therefore, the appended claims are intended to encompass within their scope all such modifications as are within the true spirit and scope of this invention.

What is claimed is:

1. An integrated circuit comprising one or more columns of memory cells, each column comprising:
   one or more memory cells, each memory cell comprising:
      a set of floating-gate transistors, each floating-gate transistor comprising a first source connected to a first signal line for receiving a first signal to enable a read operation of each memory cell, a first drain, a first well electrode connected to a second signal line for receiving a second signal applying a voltage to a well region in each of the floating-gate transistor, and a floating gate separated from the first drain and the first source by a gate oxide; and
      a set of cell readout transistors, each cell readout transistor comprising a second source connected to the first drain of one of the floating-gate transistors, a second drain, a second well electrode connected to the second signal line, a first non-floating gate connected to a third signal line for receiving a third signal, the third signal in combination with the first and the second signals controlling an operation mode of the memory cell; and
   a set of column readout transistors, each column readout transistor comprising a first node connected to the second drain of one of the cell readout transistors, a second non-floating gate connected to a fourth signal line for receiving an inverted version of the third signal, and a second node connected to a data line for reading out data stored in the memory cell.

2. The integrated circuit of claim 1, wherein the floating gate of each of the floating-gate transistors is coupled to a column signal line via a capacitor.

3. The integrated circuit of claim 2, wherein the capacitor comprises a shorted transistor.

4. The integrated circuit of claim 2, wherein the capacitor comprises one of poly-poly capacitor or poly-metal capacitor.

5. The integrated circuit of claim 1, wherein the floating gate transistors are p-type field-effect transistors (FETs).

6. The integrated circuit of claim 5, wherein the cell readout transistors are p-type FETs.

7. The integrated circuit of claim 6, wherein the column readout transistors are n-type FETs.

8. The integrated circuit of claim 1, wherein the set of column readout transistors outputs differential signals at second nodes in a read mode.

9. The integrated circuit of claim 1, wherein the first node is a drain and the second node is a source.

10. The integrated circuit of claim 1, wherein the second signal is shared with at least one other memory cell in a row of memory cells in the integrated circuit.

11. A method for operating a memory cell in an array of memory cells, comprising:
   receiving a first signal, for enabling a read operation of the memory cell, at first sources of floating-gate transistors in the memory cell;

receiving a second signal at well electrodes of the floating gate transistors for applying a voltage to well regions in the floating-gate transistors;

receiving a third signal at gates of first readout transistors serially connected to the floating-gate transistors, the third signal in combination with the first and the second signals controlling an operation mode of the memory cell;

receiving an inverted version of the third signal at gates of second readout transistors connected to the first readout transistors serially connected to the first readout transistors; and outputting data at nodes of the second readout transistors in a read mode defined by the first, second and third signals.

12. The method of claim 11, further comprising:

receiving a first column signal at a floating gate of one of the floating-gate transistor; and receiving a second column signal at a floating gate of the other floating-gate transistor.

13. The method of claim 11, wherein the floating gate transistors are p-type field-effect transistors (FETs).

14. The method of claim 13, wherein the first readout transistors are p-type FETs.

15. The method of claim 14, wherein the second readout transistors are n-type FETs.

16. The method of claim 11, wherein the data is output from the nodes as differential signals.

17. A memory cell in an integrated circuit, comprising:

a set of floating-gate transistors, each floating-gate transistor comprising a first source connected to a first signal line for receiving a first signal to enable a read operation of the memory cell, a first drain, a first well electrode connected to a second signal line for receiving a second signal applying a voltage to a well region in each of the floating-gate transistor, and a floating gate separated from the first drain and the first source by a gate oxide; and a set of cell readout transistors, each cell readout transistor comprising a second source connected to the first drain of one of the floating-gate transistors, a second drain, a second well electrode connected to the second signal line, a first non-floating gate connected to a third signal line for receiving a third signal, the third signal in combination with the first and the second signals controlling an operation mode of the memory cell, and wherein each cell readout transistor is connected to one of a column readout transistor in a set of column readout transistors, each column readout transistor in the set comprising a first node connected to the second drain of one of the cell readout transistors, a second non-floating gate connected to a fourth signal line for receiving an inverted version of the third signal, and a second node connected to a data line for reading out data stored in the memory cell.

18. The memory cell of claim 17, wherein the floating gate of each of the floating-gate transistors is coupled to a column signal line via a capacitor.

19. The memory cell of claim 17, wherein the floating gate transistors are p-type field-effect transistors (FETs), the cell readout transistors are p-type FETs, and the column readout transistors are n-type FETs.

20. The memory cell of claim 17, wherein the second signal is shared with at least one other memory cell in a row of memory cells in the integrated circuit.

* * * * *